United States Patent [19]

Bilger et al.

[11] 4,283,590
[45] Aug. 11, 1981

[54] METHOD FOR PRODUCTION OF SOLAR CELLS AND SOLAR CELLS PRODUCED THEREBY

[75] Inventors: Gerhard Bilger, Stuttgart; Gert Hewig, Steinenbronn; Fritz Pfisterer, Lauffen; Hans-Werner Schock, Herrenberg, all of Fed. Rep. of Germany

[73] Assignee: Werner H. Bloss, Winterbach, Fed. Rep. of Germany

[21] Appl. No.: 926,433

[22] Filed: Jul. 20, 1978

[30] Foreign Application Priority Data

Jul. 21, 1977 [DE] Fed. Rep. of Germany ....... 2732933

[51] Int. Cl.³ .................... H01L 31/06; H01L 31/18
[52] U.S. Cl. .................... 136/251; 29/572; 136/257; 136/260; 357/30; 427/74
[58] Field of Search ....... 29/572; 136/89 CU, 89 CL, 136/244, 251, 260, 257; 357/16, 30; 427/74

[56] References Cited

U.S. PATENT DOCUMENTS

| Re. 29,812 | 10/1978 | Jordan | 357/16 |
|---|---|---|---|
| 3,346,419 | 10/1967 | Webo | 136/89 CL |
| 3,888,697 | 6/1975 | Bogus | 357/30 |
| 4,083,097 | 4/1978 | Anagnostou et al. | 29/572 |
| 4,084,985 | 4/1978 | Evans, Jr. | 136/251 |
| 4,127,424 | 11/1978 | Ullery, Jr. | 136/244 |

FOREIGN PATENT DOCUMENTS 48-5227 2/1973 Japan ................... 136/89 CD

OTHER PUBLICATIONS

W. L. Crawford et al., "Pluggable Solar Cell", *IBM Tech. Disc. Bull.*, vol. 4, p. 62 (1962).
J. A. Minnucci et al., "Integral Glass Sheet Encapsulation for Terrestrial Panel Applications", *Conf. Record, 12th IEEE Photovoltaic Specialists Conf.* (1976), pp. 309-312.

*Primary Examiner*—Aaron Weisstuch
*Attorney, Agent, or Firm*—Craig and Antonelli

[57] ABSTRACT

A method for the production of solar cells with a thin-layer PN heterojunction, having a cadmium sulfide layer vapor deposited on an electrically conductive support and a cuprous sulfide layer chemically produced on the cadmium sulfide layer, and having an electrically conductive grid in contact with the cuprous sulfide layer, wherein the two layers and the conductive support are formed into one structural part, and the conductive grid is formed into a second structural part including a covering glass member, and the two structural parts are adhesively joined to form a closed encapsulated cell.

32 Claims, 4 Drawing Figures

METHOD FOR PRODUCTION OF SOLAR CELLS AND SOLAR CELLS PRODUCED THEREBY

The invention relates to a method for production of solar cells with thin-film PN heterojunction, from a cadmium sulfide layer vapor deposited on an electrically conductive base and a cuprous sulfide layer produced chemically thereon, with which an electrically conductive grid is in contact.

Cadmium sulfide solar cells, as opposed to known silicon single-crystal solar cells, have the substantial advantage that they can be produced more economically. It is known that a semiconductor photo element can be produced which is made of a thin silicon single crystal with P and N zones, which is subsequently potted by enclosing it with cast resin or the like. Cadmium sulfide solar cells which are so-called thin-film solar cells have a photocrystalline semi-conductor layer that is vapor deposited on an electrically conductive support, usually a metallic support, so that their production is substantially more economical. It is known how to pot them like silicon solar cells. The manufacturing outlay is only diminished with respect to the production of the semiconductor layers, so that on the whole the expense is still relatively high, especially if a number of solar cells are to be combined to form solar batteries. In that case additional support materials have to be provided, which raises the cost still more. There are calculations, according to which, on the basis of these costs for production of a planar solar battery, the acceptable utilization of it for feeding into a supply network is possible only if there is at least an efficiency of 7%. This is of the order of magnitude that has been attainable thus far for cadmium sulfide solar cells.

The invention is addressed to the problem of creating a method for production of cadmium sulfide solar cells that will make possible economical manufacture of a finished potted solar cell with a favorable level of efficiency. The invention comprises a method wherein the cadmium sulfide layer and the cuprous sulfide layer are applied on a structural part that serves as the lower part, which subsequently is joined with a previously formed upper part which comprises a cover glass with an adhesive and the conductive grid, to constitute a closed encapsulated cell, and the solar cell formed thereby.

By this method, the so-called "area costs" in manufacture of solar cells are reduced substantially, because in most cases the cover glass is sufficient to ensure adequate mechanical strength. Use of the cover glass has the further advantage that the UV fraction of impinging light is filtered out by the cover glass, so that damage to the adhesive need not be a matter of concern, even over long periods of use.

In another arrangement of the invention, it is provided that the lower part contains a glass plate on which advantageously, with use of a bonding promoter, a base layer of silver or zinc is applied, on which the cadmium sulfide layer is vapor deposited. Use of a glass plate in the lower part has the advantage that only the mechanical strength is enhanced, but that also uniform thermal dilatation of the whole cell is ensured, so that destruction or damage from thermal stresses is not to be anticipated, even if the solar cells that are intended particularly for terrestrial use are set up in regions in which, for example, there are very great differences between day and night temperatures. A thin vapor deposited layer of chromium or titanium may serve as bonding promoter, for example.

In an advantageous arrangement of the invention, it is provided that the silver or zinc base layer will be vapor deposited with the lower part at about 350°–450° C. This leads to the advantage that on the one hand any water vapor which may be present can escape, while on the other hand the base layer, which is preferably silver, will crystallize out better, leading to a better crystalline structure of the cadmium sulfide layer that is applied next.

To obtain the greatest possible homogeneity of the cadmium sulfide layer, in an especially advantageous arrangement according to the invention, it is provided that the cadmium sulfide layer will be vapor deposited through a quartz frit onto the base layer. As opposed to the known method, whereby cadmium sulfide is vapor deposited through quartz wool or the like, this leads to a substantial improvement in the homogeneity. This vapor deposition of cadmium sulfide through a quartz frit is suitable for production of solar cells that are manufactured in other ways.

In a further arrangement of the invention, it is provided that the cadmium sulfide layer will be roughened, advantageously by etching, before production of the cuprous sulfide layer. In this way on the one hand possible damaging reflection is reduced, while on the other hand the grain boundaries are etched out.

In another arrangement according to the invention, a copper layer is vapor deposited on the cuprous sulfide layer, whereafter the under part is heated to about 160°–200°. This subsequently vapor deposited copper and heat treatment has the effect that empty places which may exist in the cuprous sulfide can be filled by diffusion. If this heat treatment occurs in atmospheric conditions, a thin layer of copper protoxide ($Cu_2O$) is formed on the surface. This has the effect that an electron reflecting potential develops on the surface, thereby diminishing surface recombination of the electrons in the cuprous sulfide.

It is provided in a further arrangement to the invention that a heat-sealing adhesive will be applied to the cover glass of the upper part, a copper foil is then held thereto, a grid is subsequently etched out from the copper foil, and thereafter upper part and lower part are heat-sealed under vacuum, by means of the heat-sealing adhesive of the upper part. The heat-sealing adhesive thus first has the function of holding the copper foil on the upper part and then producing the seal between the upper part and the lower part.

It is advantageously provided that the heat-sealing adhesive will be applied in the fluid state and then subsequently dried in a vacuum, and thereafter optionally dried in air. By the first vacuum drying, all gases and vapors that might destroy the electrical properties of the solar cell are carried off and an adhesive layer is produced which then allows heat-seal bonding, the thickness of the adhesive layer being somewhat greater than that of the grid. The subsequent air drying that may occur leads to an oxidation of the heat-sealing adhesive layer which may be advantageous in some cases.

It is advantageously provided that before the joining of the upper part and the lower part, a thin gold layer will be electro-deposited on the grid, to produce a contact that has no insulating layer.

A solar cell can be produced by the process of the invention, in which a base plate, consisting advantageously of glass, with an electrically conductive base, a cadmium sulfide layer and a cuprous sulfide layer, forms a prefabricated lower part that is joined with a cover glass with an electrically conductive grid, which forms the upper part, to make an encapuslated cell. Such a solar cell is ready for use and has substantial mechanical strength which makes it possible to put together a solar cell like this with others as a solar battery, especially for terrestrial use, without the need to provide expensive mechanical support elements.

In an advantageous embodiment of the invention, the cover glass with the grid, and the base plate with the base layer, are shifted laterally in such a way that on one side a contact is exposed that comprises the base layer, and on the other side one that is formed by the grid. Such a solar cell is very simply connected with other solar cells because the necessary contacts are provided and are freely accessible.

In an advantageous arrangement of the invention, a large-area cover glass is provided as the upper part, with a plurality of electrically conductive grids disposed in a row, whereof with each of this plurality respectively an under part is associated which is shifted with respect to its respective grid in such a way that each base layer of each under part is unilaterally in contact with the grid associated with the adjacent under part, and so that on one side of the cover glass there is an edge of the base layer of the outer under part, exposed as a contact. Thereby in a simple way a complete connected solar battery can be produced in which a single cover glass will serve as support for a number of solar cells. In a further arrangement of the invention it can be provided that there will be a large-area cover glass with several rows of grids and correspondingly several rows of under parts. In this way, a very rational manufacture will be attained, whereby the somewhat more simply constructed upper part will take in a large area, whereas the under parts will be made as individually manufactured elements of suitable size for application of the cadmium sulfide layer.

Other features and advantages of the invention are to be seen in the following description of the embodiments shown in the drawing.

Figure 1:
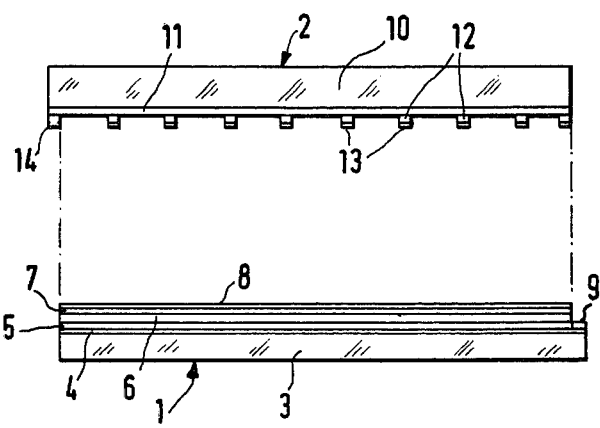
FIG. 1 shows a schematic representation of a solar cell produced according to the method of the invention, in which the under part and the upper part are still separated.

The solar cell shown in FIG. 1 has a prefabricated under part 1 and a prefabricated upper part 2, which are joined in a subsequent work step of themselves to constitute an encapsulated cell.

Under part 1 has a base plate 3 which advantageously consists of a glass substrate. This glass is cleaned with ultrasound in a solvent, for example, * before application on one side, of a layer 4 of an adhesion promotor, for which preferably vapor deposited chromium (Cr) is used. On this adhesion promotor, a silver (Ag) layer 5 is likewise vapor deposited. This vapor deposition of both the adhesion promotor and the silver is effected at about 350°–450° C., leading on the one hand to a release of water vapor and on the other hand to good crystallizing of silver layer 5, which is advantageous for the subsequent work steps.

The glass cleaning can be carried out in the following procedure:
Ultrasonic bath 1: Phosphate cleaner (Phosphatreiniger), for example Grisiron 6729 and Grisiron 9116 or 9516
Bath 2: Deionized water
Ultrasonic bath 3: Degreasing (Entfettung) for example Grisament 2324
Bath 4: Deionized water
Bath 5: Dehydrator (Wasserverdranger) for example Dewatol 40
Bath 6: Tetrachlorethylene vapor for drying
Reagent of bath 1 and 3: Firma Hoechst AG, D 6230 Frankfurt 80
Reagent of bath 5: Haug chemie, Breite Seite 14–16, D 6920 Sinsheim.

On silver layer 5, a layer of cadmium sulfide (CdS) about 30 μ (possible 15–40μ) thick is vapor deposited. This vapor deposition is effected in the device illustrated in FIG. 4, which will be described later. In this CdS deposition step, lower part 1, which thus far has been fabricated, is held at a temperature of 170°–220° C.

Next the cadmium sulfide layer 6 is roughened to diminish reflection and to etch out the grain boundaries, for example, by means of an aqueous hydrochloric acid (HCl) solution (for example 10–20% aqueous solution). On cadmium sulfide layer 6 there is then produced a cuprous sulfide ($Cu_2S$) layer 7, by a chemical reaction, in that the lower part is dipped for about 5 to 10 seconds in a monovalent copper ion solution (for example, a 0.03–02 m(molar) $Cu^+$-solution). This cuprous sulfide layer is to have a thickness of the order of magnitude of 0.1–0.3 μ.

On the cuprous sulfide layer 7 another copper (Cu) layer 8 is vapor deposited, for example, at a temperature of 20–40° C., with a thickness of 30 to 100 Å. Then the under part is heated in air, to about 160°–200° C., whereby the filling up of spaces in the cuprous sulfide is accomplished by diffusion of the copper, and development of a copper protoxide ($Cu_2O$) layer is made possible. With this work step, production of under part 1 is completed. As FIG. 1 shows, layers 6, 7 and 8 are applied in such a way that in FIG. 1 at the right there is an exposed edge strip 9 of silver under-layer 5, which can later be utilized as a contact.

Upper part 2 is also produced separately. It has a cover glass 10 which also is cleaned with ultrasound in a solvent (for example, see attached paper) before further processing. On this cover glass 10 a liquid heat-sealing adhesive 11 with a layer thickness of 120 to 150μ is first applied; by means of a blade or the like. In practice here, a polyester urethene in chlorized hydrocarbons, has been suitable, for example the adhesive made by Kömmerling Company, Zweibrücker Landstrasse, D-6780 Pirmasens: this product is known commercially as AK 543. Cover glass 10 and the applied heat-sealing adhesive 11, which is first fluid, are dried in a vacuum furnace or in air at a temperature of 60° C. to 11° C. for 2–5 hours, so that vapors and other phases can escape from the heat-sealing adhesive, which is fluid at first. It has been found that an alternative drying also at elevated temperature, for example, 60–110° C., in air, can be advantageous, where presumably there is oxidation of the heat-sealing adhesive 11. In the course of this drying process, the heat-sealing adhesive is reduced in thickness to about 25% of the originally applied layer, which was 120 to 150μ. By means of the heat-sealing adhesive 11, a copper foil of 17–35μ in thickness is then sealed onto glass 10, at about 140° to 180° C. From this copper foil, the grid 12 shown in FIG. 1 is then etched out, whereby the technique known for production of printed circuits is used. In this technique, a lacquer grid is applied, using the silk screen process, corresponding to grid 12. The transparency of the grid is typically between 80 and 95 %. Typical mesh sizes, perpendicular to the external connector of the cell, are 10 to 20 lines per cm and 1 to 3 lines per cm parallel to the external connector of the cell. The thickness of the wires are 30 to 100μ and 50 to 150μ, respectively. After grid 12 has been produced by etching, for example using an etching solution like $FeCl_3 \cdot 6H_2O$ or $(NH_4)_2 S_2O_8$, and the lacquer has been removed, a gold layer 13 is applied on the grid by electrodeposition, to make possible an ohmic contact that has no rectifying characteristic. The thickness of the gold layer is about 100 to 1000 Å, advantageously 250 Å.

Upper part 2, which is now finished, is joined with lower part 1 in a vacuum press at about 170° to 180° C., whereby the seal is obtained by means of layer 11 of the heat-sealing adhesive, which has a layer thickness that is somewhat more than the thickness of grid 12. Grid 12 is applied with its gold layer 13 on copper 8 and constitutes a reliable contact, while in the subsequent heating, grid 12 penetrates into layer 11, which layer 11 also makes an adhering seal between cover glass 10 and layer 8. Upper part 2 is applied on lower part 1, set off in such a way that strip 14 of grid 12, at the left in FIG. 1, i.e., the strip on the upper part 2 on the side opposite contact strip 9, is exposed, likewise serving as a contact. After this joining of upper and lower parts, there is a solidly enclosed cell that needs no further treatment or reinforcement. It may be advantageous to seal the edges that run crosswise to contact strips 9 and 14, for example by glueing, welding or soldering cover plate 10 and base plate 3.

Figure 2:
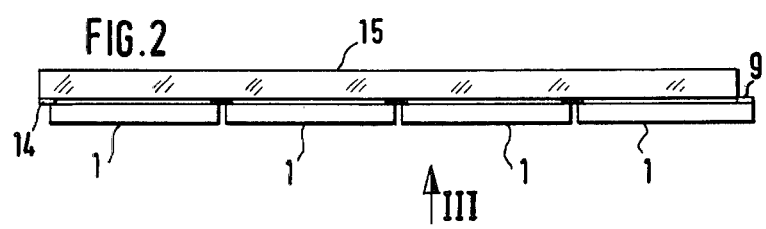
FIG. 2 is a lateral view of several cells and a single cover glass, forming a solar battery.
Figure 3:
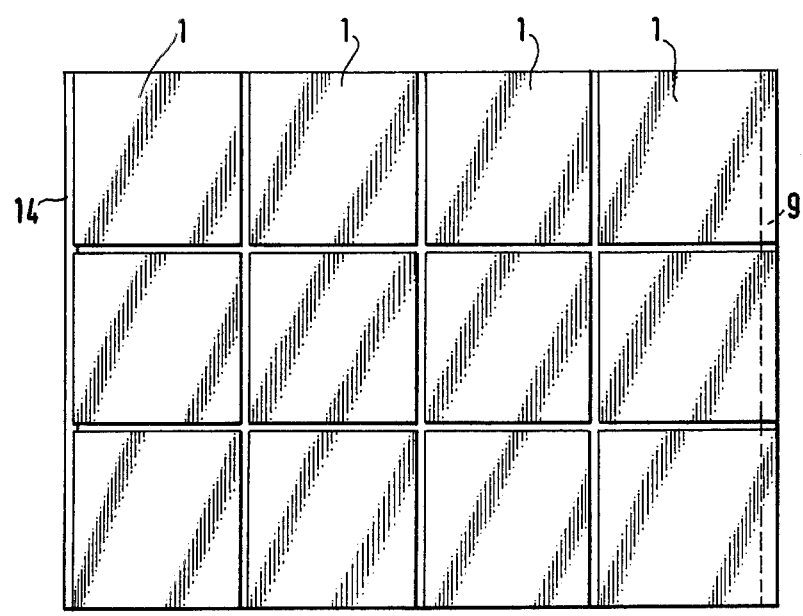
FIG. 3 is a view of the solar battery of FIG. 2, in the direction of arrow III.

A solar battery can be put together from the solar cells shown in FIG. 1, whereby then the contacts formed by edge strips 9 and 14 connect adjacent solar cells. To save extra supporting elements in construction of a solar battery, a common cover glass 15 can be provided for several solar cells, as shown in FIGS. 2 and 3. Thereby under parts 1 are used that are made according to the above description. These under parts are advantageously prepared in a specific size, in which they can be manufactured economically. On the other hand, there are no major difficulties in making the common cover glass 15 with a large area, and providing a plurality of grids 12 as described above. The contacts between the individual solar cells are made in the way that corresponds to FIG. 1, which is merely indicated schematically in FIG. 2. Here, in the case of those solar cells that are disposed in a row, a contact of grid 12 with silver layer 5 that serves as electrically conductive base is prepared. As FIG. 3 shows, obviously several rows of such cells can be fixed to the common cover glass. The fastening then is effected by heat-sealing adhesive layer 11 in a single work step. In practice, it is advantageous to seal off the faces between contacts 14 and 9 as well as the joints between the individual cells, which can be done by filling in with an adhesive or the like. It is also possible to solder or weld the glass plates.

Figure 4:
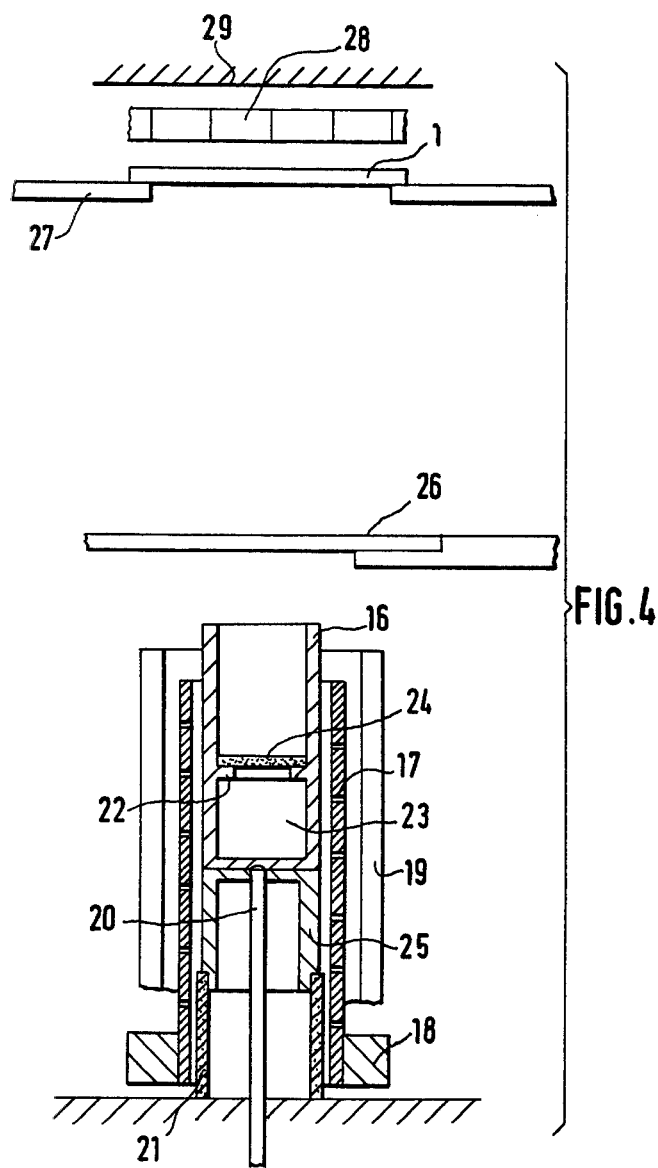
FIG. 4 schematically shows a device for vapor deposition of a cadmium sulfide layer.

FIG. 4 schematically shows a device with which a homogeneous layer of cadmium sulfide can be vapor deposited on an under part 1 of a solar cell. For this there is a provision of a graphite furnace 16 that is surrounded by a graphite heating coil 17, to which a current supply 18 is connected. On the outside, graphite heating coil 17 is enclosed by a radiation reflector 19. A thermoelement 20 for measurement of the temperature, for temperature regulation, extends into graphite furnace 16. The graphite furnace is seated on an insulating ceramic ring 21. Graphite furnace 16 has a cylindrical configuration and the cylinder is divided by an annular collar 22 into an open chamber 23 that is open toward the top. The pulverous cadmium sulfide is charged into chamber 23. Chamber 23 is closed off at the top by a porous quartz frit 24 with a porosity of 30–100μ, which is closely fitted into the cylindrical part on the far side of annular collar 22. For this advantageously the quartz frit 24 and the inner surface of graphite furnace 16 are polished. To allow acceptable work, it is advantageous to melt the quartz frit 24 into a quartz glass tube, which is then polished on the outside. Quartz frit 24 is secured in its position by one or more pins, in a way that is not shown in detail. Quartz frit 24 is disposed at a suitable distance from the end of graphite furnace 16, that is, at about one third of the height, so that in the quartz frit zone such a high temperature will be sustained that condensation on the frit which would thereby make it impermeable will reliably be avoided. A cylindrical piece 25 is connected to the graphite furnace at the bottom, and is seated on the ceramic ring. This piece encloses thermoelement 20 over a sufficient length so that thereby it will be ensured that the temperature measured by thermoelement 20 will correspond as precisely as possible to the temperature of chamber 23.

Above the outlet of graphite furnace 16 there is a slidable shutter 26 with which at first the cadmium sulfide vapor can be received by, preventing uncontrollable deposition of CdS on part 1 of the solar cell. This under part 1 lies on a support 27 that leaves free a cutout of the area of under part 1 that is to be vapor coated with cadmium sulfide. On the opposite side there is a heating part 28 made as a graphite meander, which is covered by a radiation reflector 29. This heating part 28 ensures that the under part of the solar cell will maintain a temperature of about 200° C. during the vapor deposition of the cadmium sulfide.

We claim:

1. A method for the production of closed encapsulated solar cells with a thin film PN heterojunction, having a cadmium sulfide layer deposited on an electrically conductive support and a cuprous sulfide layer chemically produced on the cadmium sulfide layer, comprising the steps of depositing a layer of cadmium sulfide on an electrically conductive support, chemically producing a cuprous sulfide layer on the cadmium sulfide, thereby forming a lower part comprising the electrically conductive support, the layer of cadmium sulfide, and the layer of cuprous sulfide; depositing an adhesive material on a cover glass member, forming a conductive grid on the adhesive material, the cover glass member, adhesive material, and conductive grid forming an upper part; and joining the upper part with the lower part by means of said adhesive material, having the electrically conductive support and cover glass member be outer surfaces of the joined member, whereby the interface between the upper part and the lower part is formed between the electrically conductive grid and the cuprous sulfide layer, to form closed encapsulated solar cells.

2. A method for the production of closed encapsulated solar cells as in claim 1, wherein said cadmium sulfide layer is vapor deposited on said electrically conductive support.

3. A method for the production of closed encapsulated solar cells as in claim 2, wherein said electrically conductive support comprises an electrically conductive member positioned on a structural part.

4. A method for the production of closed encapsulated solar cells as in claim 2 or 3, wherein the cadmium sulfide layer is deposited on the electrically conductive support through a quartz frit.

5. A method for the production of closed encapsulated solar cells as in claim 2 or 3, wherein the vapor deposited cadmium sulfide layer is etched, in order to roughen the cadmium sulfide layer, before chemically producing the cuprous sulfide layer.

6. A method for the production of closed encapsulated solar cells as in claim 3, wherein said structural part is a glass plate and said electrically conductive member is constructed of a layer of material selected from the group of silver and zinc.

7. A method for the production of closed encapsulated solar cells as in claim 6, wherein an adhesion promoter is disposed on the structural part and the electrically conductive member is on the adhesion promoter, whereby adhesion of the electrically conductive member to the structural part is promoted.

8. A method for the production of closed encapsulated solar cells as in claim 7, wherein the adhesion promoter is a layer of a material selected from the group consisting of chromium and titanium, and said adhesion promoter is disposed on the structural part by vapor depositing the adhesion promoter on the structural part.

9. A method for the production of closed encapsulated solar cells as in claim 7, wherein, in joining the upper and lower parts, on one side an edge strip of the grid is exposed to serve as a contact and on the opposite side an edge strip of the electrically conductive support of the lower part is exposed to serve as a contact.

10. A method for the production of closed encapsulated solar cells as in claim 6 or 7 or 8, wherein the electrically conductive member is formed by vapor depositing the material selected from the group consisting of silver or zinc at about 400° C.

11. A method for the production of closed encapsulated solar cells as in claim 1, wherein said electrically conductive support comprises an electrically conductive member positioned on a structural part.

12. A method for the production of closed encapsulated solar cells as in claim 1, 2 or 11, wherein, after the cuprous sulfide layer has been chemically produced, a copper layer is vapor deposited on the cuprous sulfide layer, and thereafter the lower part, including the copper layer, is heated to about 180° C.

13. A method for the production of closed encapsulated solar cells as in claim 12, wherein the lower part is heated to about 180° C. in air, whereby a layer of copper protoxide is formed on the surface.

14. A method for the production of closed encapsulated solar cells as in claim 12, wherein, in joining the upper and lower parts, on one side an edge strip of the grid is exposed to serve as a contact and on the opposite side an edge strip of the electrically conductive support of the lower part is exposed to serve as a contact.

15. A method for the production of closed encapsulated solar cells as in claim 1, 2, 3 or 11, wherein said adhesive material deposited on the cover glass member is a heat-sealing adhesive.

16. A method for the production of closed encapsulated solar cells as in claim 15, wherein said conductive grid is formed on the adhesive material by first adhering a copper foil to the adhesive material and then etching out a grid pattern on said copper foil.

17. A method for the production of closed encapsulated solar cells as in claim 16, wherein the upper part and lower part are joined by heat-sealing the upper part to the lower part under vacuum by means of said heat-sealing adhesive.

18. A method for the production of closed encapsulated solar cells as in claim 17, wherein a thin gold layer is formed on the conductive grid by electrodeposition, prior to joining the upper part and the lower part, to produce a contact which is free of insulation.

19. A method for the production of closed encapsulated solar cells as in claim 17, wherein, in joining the upper and lower parts, on one side an edge strip of the grid is exposed to serve as a contact and on the opposite side an edge strip of the electrically conductive support of the lower part is exposed to serve as a contact.

20. A method for the production of closed encapsulated solar cells as in claim 15, wherein the heat-sealing adhesive is fluid when deposited on the cover glass member and is subsequently dried in a vacuum.

21. A method for the production of closed encapsulated solar cells as in claim 20, wherein the heat-sealing adhesive is dried in air after the vacuum drying.

22. A method for the production of closed encapsulated solar cells as in claim 1, 2, 3 or 11, wherein a thin gold layer is formed on the conductive grid by electrodeposition, prior to joining the upper part and lower part, to produce a contact which is free of insulation.

23. A method for the production of closed encapsulated solar cells as in claim 1, 2, 3 or 11, wherein a plurality of electrically conductive grids are formed in at least one row on the adhesive material on a cover glass member, each of the grids having a single lower part associated therewith when the upper and lower parts are joined, whereby a plurality of solar cells are formed under a cover glass member.

24. A method for the production of closed encapsulated solar cells as in claim 22, wherein the upper and lower parts are joined such that each lower part associated with each grid is shifted along the row in such a way with respect to its grid that the electrically conductive support of each lower part is in contact with the grid associated with the adjacent lower part in the same row.

25. A method for the production of closed encapsulated solar cells as in claim 24, wherein, in joining the upper and lower parts, on one side an edge strip of the grids is exposed to serve as a contact and on the opposite side an edge strip of the electrically conductive supports of the lower parts is exposed to serve as a contact.

26. The product made by the method of claim 25.

27. The product made by the method of claim 23.

28. A method for the production of closed encapsulated solar cells as in claim 1, 2, 3 or 11, wherein, in joining the upper and lower parts, on one side an edge strip of the grid is exposed to serve as a contact and on the opposite side an edge strip of the electrically conductive support of the lower part is exposed to serve as a contact.

29. A method for the production of closed encapsulated solar cells as in claim 1, 2, 3 or 11, wherein the thickness of the adhesive material is greater than the thickness of the electrically conductive grid.

30. Closed encapsulated solar cells comprising:
(a) an upper part comprising a cover glass member having adhesively attached thereto a plurality of individual electrically conductive grids;
(b) a plurality of lower parts, each lower part comprising a structural part, an electrically conductive support on the structural part, a cadmium sulfide layer on the electrically conductive support, and a cuprous sulfide layer on the cadmium sulfide layer;

(c) wherein the plurality of individual electrically conductive grids attached to the cover glass member are arranged in at least one row, with a lower part associated with each grid and arranged with respect to its associated grid such that the electrically conductive support of each lower part contacts the grid associated with the adjacent lower part in the row, and wherein on one side of the cover glass an edge strip of the outer grids is exposed as a contact, while on the other side an edge strip of an electrically conductive support is exposed as a contact, the lower part and upper part being joined such that the cover glass member and the structural part form the outer surface of the solar cells, whereby closed encapsulated solar cells are formed.

31. Solar cells as in claim 30, wherein a plurality of electrically conductive grids are arranged in a plurality of rows of grids and correspondingly associated therewith are a plurality of rows of lower parts.

32. Solar cells as in claim 30, wherein adjacent edges of the upper and lower parts which do not constitute the exposed contacts are sealed together.

* * * * *